United States Patent [19]

Nagano

[11] 4,442,400
[45] Apr. 10, 1984

[54] VOLTAGE-TO-CURRENT CONVERTING CIRCUIT

[75] Inventor: Katsumi Nagano, Shimonoseki, Japan

[73] Assignee: Tokyo Shibaura Denki Kabushiki Kaisha, Japan

[21] Appl. No.: 396,075

[22] Filed: Jul. 7, 1982

[30] Foreign Application Priority Data

Jul. 8, 1981 [JP] Japan .................. 56-106518

[51] Int. Cl.$^3$ ............................................. G05F 3/20
[52] U.S. Cl. ..................................... 323/315; 330/257
[58] Field of Search .............. 323/312, 313, 314, 315, 323/316; 330/252, 257, 258-260, 288; 307/296 R, 297

[56] References Cited

U.S. PATENT DOCUMENTS

| | | | |
|---|---|---|---|
| 3,434,069 | 3/1969 | Jones ................................. | 330/259 |
| 3,909,628 | 9/1975 | Muto ................................. | 323/315 X |
| 4,004,247 | 1/1977 | Van de Plassche ............ | 323/315 X |
| 4,288,707 | 9/1981 | Katakura ......................... | 330/257 X |

FOREIGN PATENT DOCUMENTS

2132293  1/1972  Fed. Rep. of Germany .
55-26748 2/1980  Japan .

OTHER PUBLICATIONS

LePage et al., "Voltage-to-Current Converter", IBM Technical Disclosure Bulletin, vol. 19, No. 4, Sep. 1976, pp. 1375-1376.

Ramaje, "Voltage-to-Current Converter", IBM Technical Disclosure Bulletin, vol. 23, No. 4, Sep. 1980, pp. 1668.

Amantea, "Voltage-to-Current Converter", RCA Technical Notes, TN No. 1242, May 28, 1980, pp. 1-3.

Primary Examiner—Peter S. Wong
Attorney, Agent, or Firm—Finnegan, Henderson, Farabow, Garrett & Dunner

[57] ABSTRACT

A voltage-to-current converting circuit which comprises a differential pair of first and second input transistors having their emitters connected through a conversion resistor. To reduce the conversion error depending upon the amplitude of an input voltage applied to the bases of the first and second transistors, the voltage-to-current converting circuit is provided with first and second constant current sources respectively connected between the collector of the first transistor and a first power supply terminal and between the collector of the second transistor and the first power supply terminal, third and fourth transistors whose collector-emitter paths are respectively connected between the emitter of the first transistor and a second power supply terminal and between the emitter of the second transistor and the second power supply terminal, and first and second base current supply circuits respectively connected between the base of the third transistor and the first power supply terminal and between the base of the fourth transistor and the first power supply terminal. In order to take out an output current, an output circuit is provided which has an output transistor having its collector-emitter path connected in series with a third constant current source between the first and second power supply terminals and its base connected to the base of the fourth transistor.

4 Claims, 10 Drawing Figures

F I G. 7
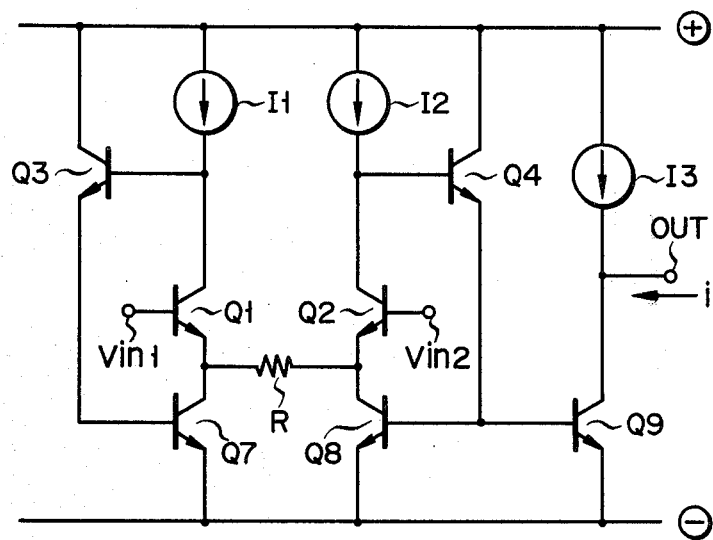

VOLTAGE-TO-CURRENT CONVERTING CIRCUIT

BACKGROUND OF THE INVENTION

The present invention relates to a voltage-to-current converting circuit which converts an input voltage to an output current.

In order to convert a voltage difference applied as an input into a change in a current, an emitter-degenerated amplifier is in general used. In this emitter-degenerated amplifier, the emitters of a pair of input transistors are connected through a conversion resistor both ends of which are connected to ground via constant current sources. In such a converting circuit, when an output current flowing through the conversion resistor is small, the output current is proportional to the difference of input voltages applied to the bases of the input transistors. However, when the output current increases, the magnitude of the output current cannot be ignored with respect to a bias current supplied by a constant current source, so that the output current does not become proportional to the difference of input voltages. In other words, when the difference of the input voltages become large, the output current will involve an error.

SUMMARY OF THE INVENTION

It is an object of the present invention to provide a voltage-to-current converting circuit which is arranged to reduce the conversion error based on the amplitude of an input signal.

A voltage-to-current converting circuit of this invention fundamentally comprises a differential pair of first and second input transistors between the bases of which an input signal voltage is applied, and a conversion resistor connected between emitters of the first and second transistors. Further, first and second constant current sources are respectively connected between the collector of the first transistor and a first power supply terminal and between the collector of the second transistor and the first power supply terminal. Third and fourth transistors have their collector-emitter paths respectively connected between the emitter of the first transistor and a second power supply terminal and between the emitter of the second transistor and the second power supply terminal. First and second base current supply circuits are respectively connected between the base of the third transistor and the first power supply terminal and between the base of the fourth transistor and the first power supply terminal. The first base current supply circuit has at least one fifth transistor having its collector-emitter path connected between the base of the third transistor and the first power supply terminal, and its base connected to the collector of the first transistor. The second base current supply circuit has at least one sixth transistor. The sixth transistor has its collector-emitter path connected between the fourth transistor and the first power supply terminal, and its base connected to the collector of the second transistor. In order to take out an output current, an output transistor is provided which has its collector-emitter path connected between an output terminal and the second power supply terminal and its, base connected to the base of the fourth transistor. A third constant current source is connected between the output terminal and the first power supply terminal.

BRIEF DESCRIPTION OF THE DRAWINGS

FIGS. 4A to 6B show frequency characteristics of the circuit of FIG. 2; and

FIG. 7 shows a modification of the voltage-to-current converting circuit according to the present invention.

DETAILED DESCRIPTION OF THE PREFERRED EMBODIMENTS

Figure 1:
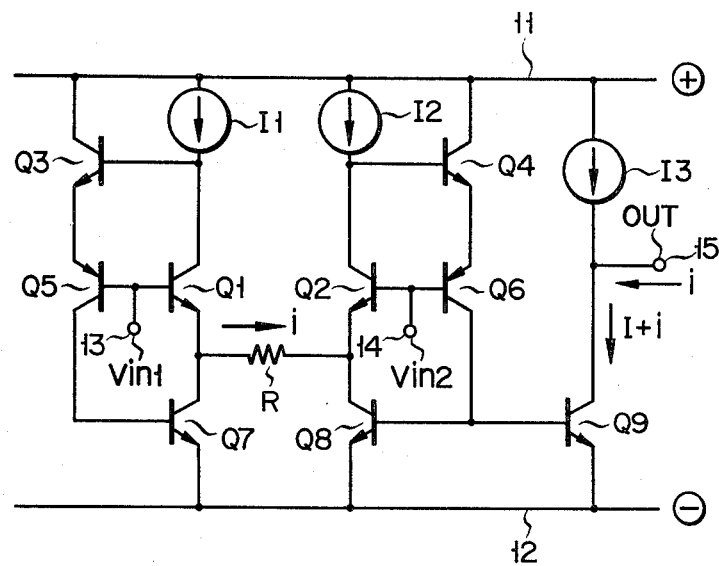
FIG. 1 is a schematic circuit diagram of a voltage-to-current converting circuit according to the present invention.

FIG. 1 shows a voltage-to-current converting circuit embodying the present invention, which comprises a differential pair of NPN transistors $Q_1$ and $Q_2$ having their emitters connected together via a conversion resistor R. The collectors of transistors $Q_1$ and $Q_2$ are connected to a positive power supply line 11 through constant-current sources $I_1$ and $I_2$, respectively.

An NPN transistor $Q_3$ has its base connected to the collector of transistor $Q_1$ and its collector connected to positive power supply line 11, while an NPN transistor $Q_4$ has its base connected to the collector of transistor $Q_2$ and its collector connected to positive power supply line 11. A PNP transistor $Q_5$ has its emitter-to-collector path connected in series with the collector-to-emitter path of transistor $Q_3$, and its base connected, together with the base of transistor $Q_4$, to an input terminal 13 to which an input voltage $V_{in1}$ is applied. A PNP transistor $Q_6$ has its emitter-to-collector path connected in series with the collector-to-emitter path of transistor $Q_4$, and its base connected, together with the base of transistor $Q_2$, to an input terminal 14 to which an input voltage $V_{in2}$ is applied. An NPN transistor $Q_7$ has its collector-to-emitter path connected between the emitter of transistor $Q_1$ and a negative power supply line 12, and its base connected to the collector of transistor $Q_5$. An NPN transistor $Q_8$ has its collector-to-emitter path connected between the emitter of transistor $Q_2$ and negative power supply line 12, and its base connected to the collector of transistor $Q_6$. Further, an NPN output transistor $Q_9$ is provided which has its base connected to the base of transistor $Q_8$, and its collector-to-emitter path connected between an output terminal 15 and negative power supply line 12. A constant current source $I_3$ is connected between output terminal 15 and positive power supply line 11. Constant current sources $I_1$, $I_2$ and $I_3$ provide an equal current value of I.

In the voltage-to-current converting circuit thus configured, the collector current of transistor $Q_1$ is the constant current I minus the base current of transistor $Q_3$. When the current amplification factor $\beta$ of transistor $Q_3$ is sufficiently large, the collector current of transistor $Q_1$ is substantially equal to I.

The collector current of transistor $Q_7$ is $I-i$, but it can be regarded as I in a small signal input condition ($I \gg i$). Therefore, the base current of transistor $Q_7$ becomes $I/\beta$. Assuming that the commonbase current amplification factor of transistor $Q_5$ is 1, the emitter current of transistor $Q_3$ is $I/\beta$, and the base current is $I/\beta^2$. Similarly, the base current of transistor $Q_4$ is also $I/\beta^2$ in the small signal input condition.

In the circuit described above, the collector currents of transistors $Q_8$ and $Q_9$ are equal to each other. Therefore, when the output current i flows into transistor $Q_9$ through output terminal 15, the collector current of transistor $Q_8$ becomes I+i. The collector current of transistor $Q_7$ is I−i.

The relationship between an input voltage ΔVin and the output current i in a large signal input condition can be expressed as below:

$$\Delta Vin = Ri + V_T \cdot \ln \frac{I - \frac{I-i}{\beta^2}}{I + \frac{I+i}{\beta^2}} \quad (1)$$

As evident from the above equation, the influence of the output current i is reduced by a factor of $\beta^2$ as compared with the conventional emitter-degenerated amplifier in which $\Delta Vin = Ri + V_T \cdot \ln(I-i/I+i)$. Accordingly, $\Delta Vin \simeq Ri$, and thus the linearity of the conversion can be improved over the conventional circuit.

The input currents $I_{in1}$ and $I_{in2}$ at input terminals 13 and 14 can be respectively expressed as below.

$$I_{in1} = \frac{1}{\beta}\left(I - \frac{I-i}{\beta^2}\right) - \frac{1}{\beta_p \beta}(I - i) \quad (2)$$

$$I_{in2} = \frac{1}{\beta}\left(I - \frac{I+i}{\beta^2}\right) - \frac{1}{\beta_p \beta}(I + i) \quad (3)$$

The first term of the right side of equation (2) represents the base current of transistor $Q_1$, and the second term represents the base current of transistor $Q_5$. The first term of the right side of equation (3) represents the base current of transistor $Q_2$, and the second term represents the base current of transistor $Q_6$. $\beta_p$ represents the common-emitter current amplification factor of PNP transistors $Q_5$ and $Q_6$.

The differential input current ΔIin can be expressed as below.

$$\Delta Iin = I_{in1} - I_{in2} \quad (4)$$

$$= \frac{2i}{\beta^3} + \frac{2i}{\beta_p \beta} = 2i\left(\frac{1}{\beta^3} + \frac{1}{\beta_p \beta}\right)$$

Assume that $\beta$ is sufficiently large, $$Iin \simeq \frac{2i}{\beta \cdot \beta_p} \quad (5)$$

The differential input resistance Rin becomes $$Rin = \frac{\Delta Vin}{\Delta Iin} = \frac{\beta_p \beta}{2} R$$

and is $\beta_p$ times that of the emitter-degenerated amplifier.

Figure 2:
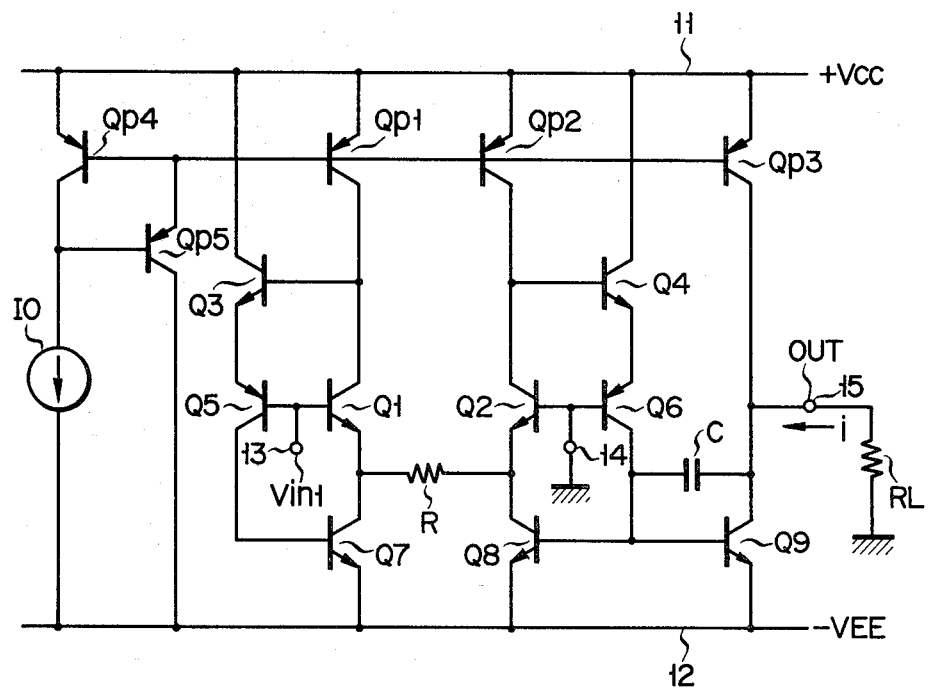
FIG. 2 is a practical arrangement of the voltage-to-current converting circuit of the present invention.

FIG. 2 shows a practical arrangement of the voltage-to-current converting circuit of FIG. 1, where a current mirror circuit ($Q_{p1} \sim Q_{p5}$) is used as the constant current sources. The collectors of transistors $Q_1$, $Q_2$ and $Q_9$ are connected to positive power supply line 11 through the collector-to-emitter paths of PNP transistors $Q_{p1}$, $Q_{p2}$ and $Q_{p3}$, respectively. The bases of transistors $Q_{p1}$, $Q_{p2}$ and $Q_{p3}$ are commonly connected to the base of PNP transistor $Q_{p4}$ having its emitter connected to positive power supply line 11. A constant current source $I_0$ is connected between the collector of transistor $Q_{p4}$ and negative power supply line 12. In order to provide a constant current of a high accuracy, a PNP transistor $Q_{p5}$ is further provided which has its emitter and base connected to the base and collector of transistor $Q_{p4}$, respectively, and its collector connected to negative power supply line 12. To prevent the occurrence of an oscillation, a capacitor C is connected between the collector and the base of transistor $Q_9$. A load resistor $R_L$ is connected between output terminal 15 and circuit ground.

Figure 3:
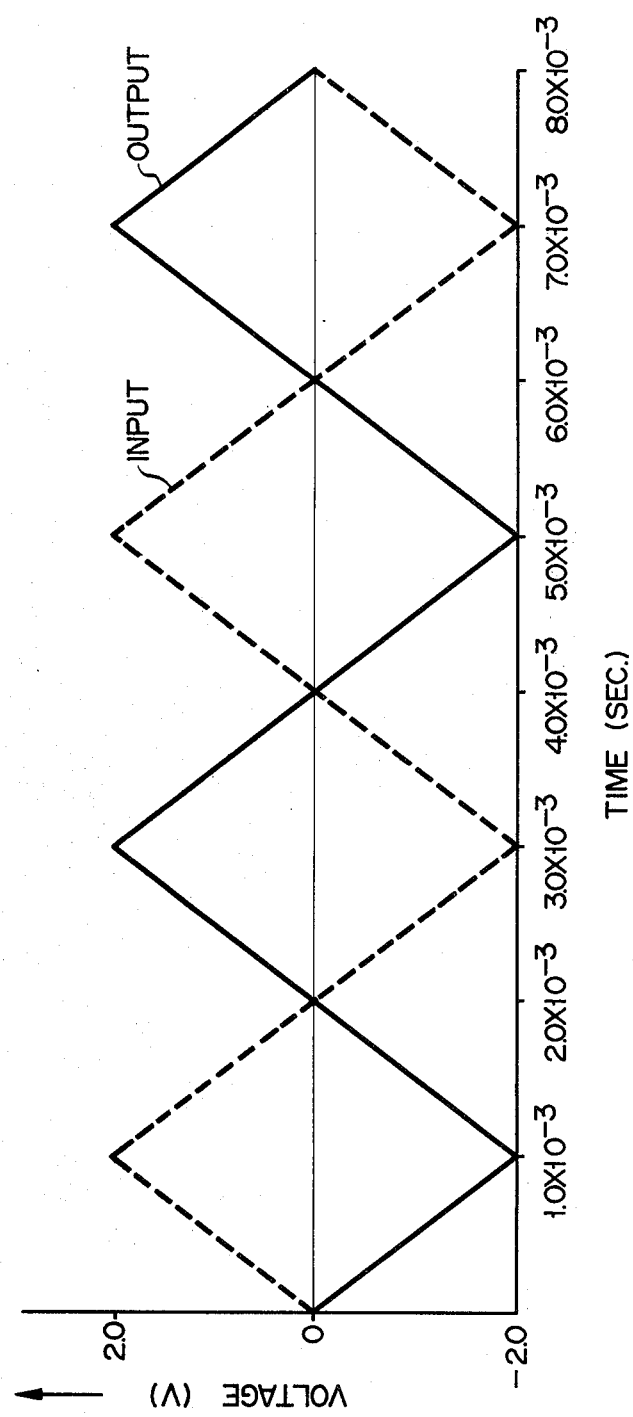
FIG. 3 is a waveform diagram of input and output signals of the circuit of FIG. 2.

With a simulation experiment using a computer simulation program (SPICE program) for integrated circuits carried out on the above circuit the characteristics as shown in FIG. 3 was obtained. In this case, R=10kω, and $R_L$=10kω. The input voltage $V_{in1}$ is applied to input terminal 13, and the other input terminal 14 is grounded. When the input voltage $V_{in1}$ is positive, an output current i flows in a direction as indicated by an arrow through output terminal 15, and the output voltage is accordingly negative. Namely, the circuit operates as an inverting amplifier having a gain of −1. In the case of the waveform diagram of FIG. 3, a triangular input voltage having an amplitude of ±2 V and a period of 4 μsec. is applied as an input voltage.

Figure 4:
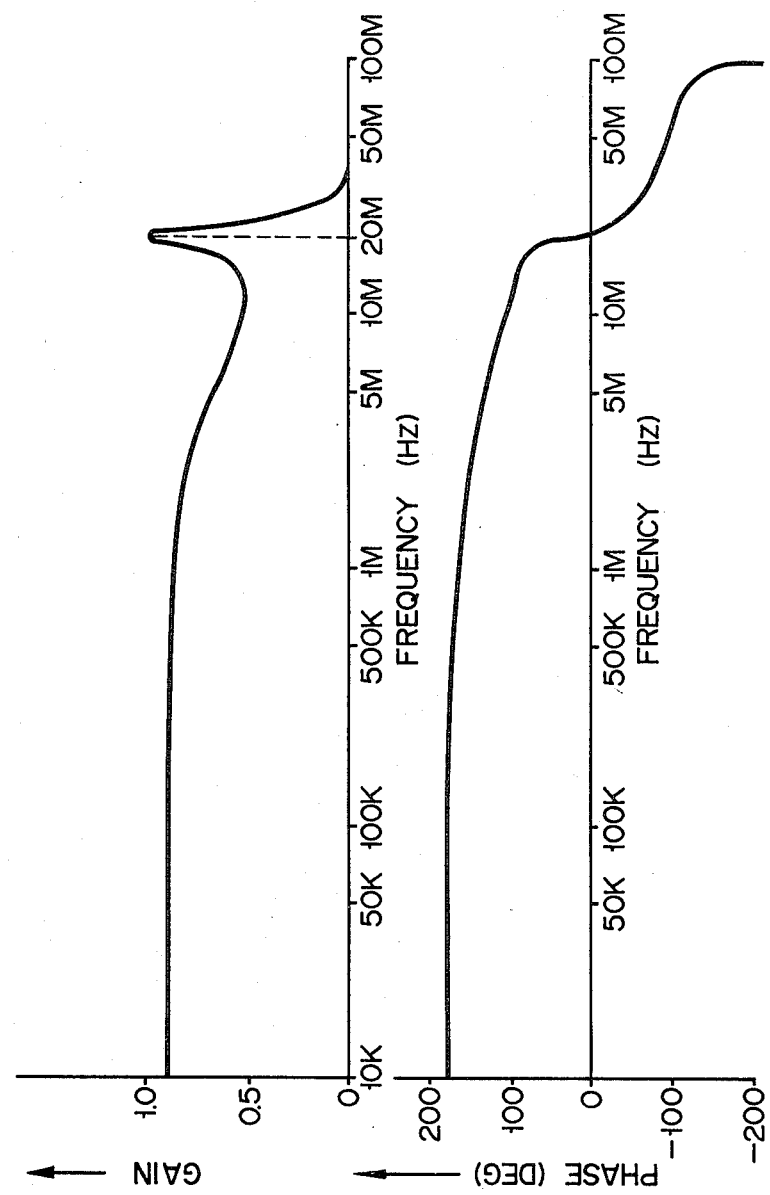
Figure 5:
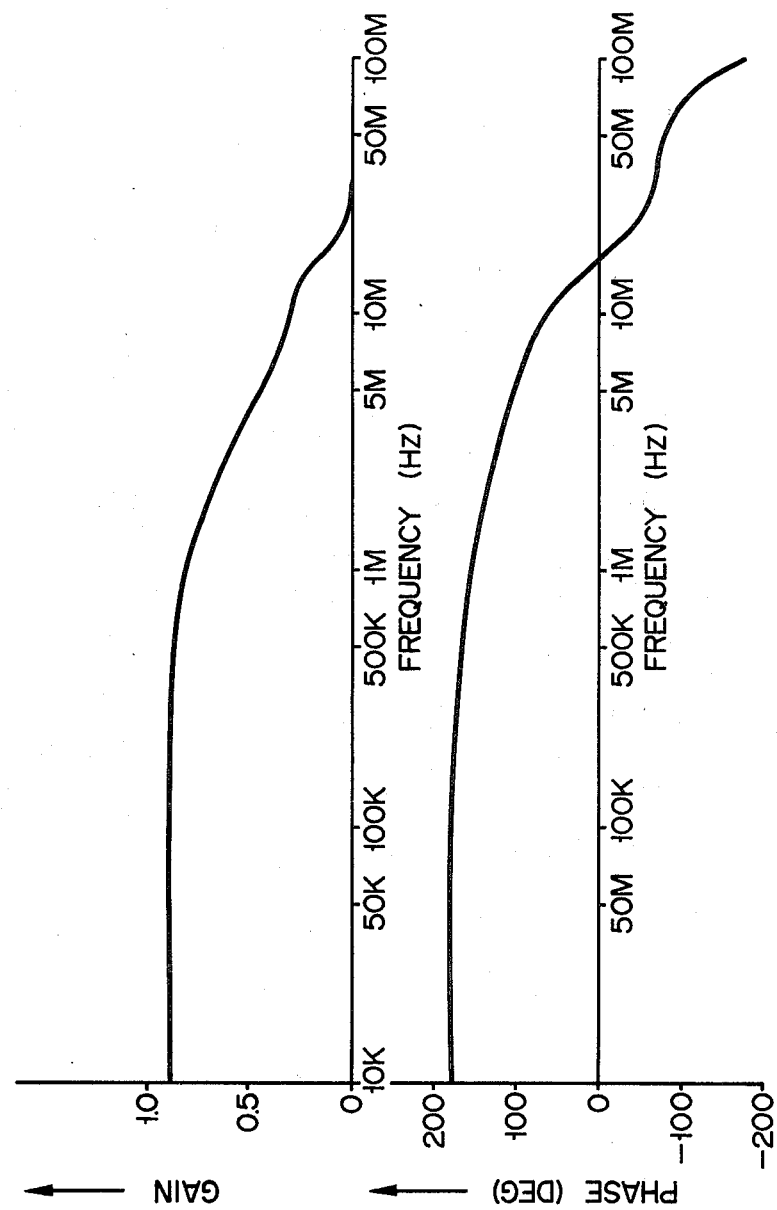
Figure 6:
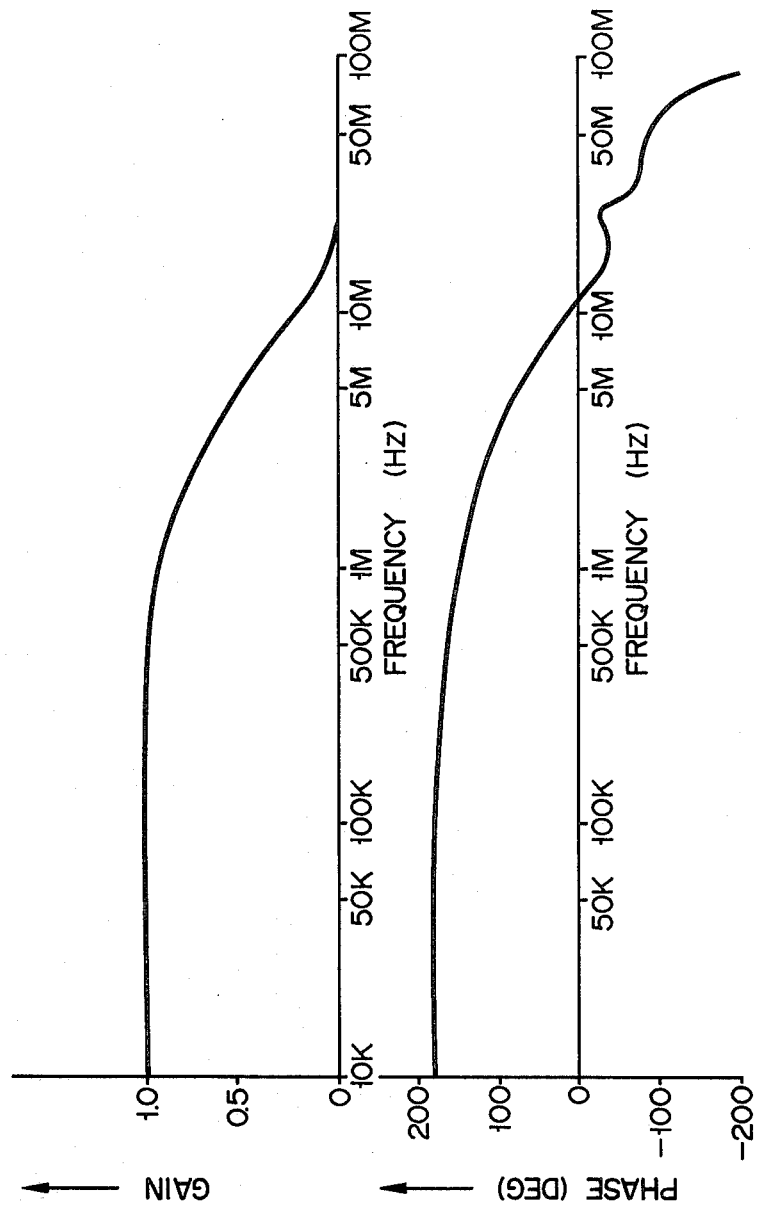

FIGS. 4A to 6B show the results of simulation experiments on the frequency characteristics of the circuit shown in FIG. 3. Particularly, FIGS. 4A, 5A and 6A show the frequency vs. gain characteristics and FIGS. 4B, 5B and 6B, the frequency vs. phase characteristics. In case of FIGS. 4A and 4B, C=1 pF, $I_0$=500 μA. In FIG. 4A, a peak of gain occurs in the vicinity of 20 MHz, which exhibits the oscillation of the circuit. In the case of FIGS. 5A and 5B, C=5 pF, and $I_0$=500 μA. In the case of FIGS. 6A and 6B, C=5 pF, and $I_0$=200 μA. In this manner, by appropriately selecting the value of capacitor C, the oscillation of the circuit can be prevented.

FIG. 7 shows a modification of the voltage-to-current converting circuit according to the present invention. In this modification, transistors $Q_5$ and $Q_6$ of FIG. 1 are removed. Even with this circuit, the voltage-to-current conversion is enabled, and the circuit can be operated from a low supply voltage (e.g., 3 $V_{BE} \sim 2.1$ V).

What is claimed is:

1. A voltage-to-current converting circuit comprising:
   a differential pair of first and second transistors each having base, emitter and collector;
   a resistor connected between the emitters of said first and second transistors;
   first and second constant current sources respectively connected between the collector of said first transistor and a first power supply terminal and between the collector of said second transistor and the first power supply terminal;
   third and fourth transistors each having base, emitter and collector, said third transistor having its collector-emitter path connected between the emitter of said first transistor and a second power supply terminal and said fourth transistor having its collector-emitter path connected between the emitter of said second transistor and the second power supply terminal;

first and second base current supply means respectively connected between the base of said third transistor and the first power supply terminal and between the base of said fourth transistor and the first power supply terminal for supplying base currents to said third and fourth transistors;

an output transistor having its collector connected to an output terminal, its emitter connected to the second power supply terminal and its base connected to the base of said fourth transistor; and a third constant current source connected between the collector of said output transistor and the first power supply terminal.

2. The voltage-to-current converting circuit according to claim 1, wherein said first base current supply means comprises a fifth transistor having its collector-emitter path connected between the first power supply terminal and the base of said third transistor and its base connected to the collector of said first transistor, and said second base current supply means comprises a sixth transistor having its collector-emitter path connected between the first power supply terminal and the base of said fourth transistor and its base connected to the collector of said second transistor.

3. The voltage-to-current converting circuit according to claim 1, wherein said first base current supply means comprises fifth and sixth transistors having their collector-emitter paths connected in series between the first power supply terminal and the base of said third transistor, said fifth transistor having its base connected to the collector of said first transistor, and said sixth transistor having its base connected to the base of said first transistor, and said second base current supply means comprises seventh and eighth transistors having their collector-emitter paths connected in series between the first power supply terminal and the base of said fourth transistor, said seventh transistor having its base connected to the collector of said second transistor, said eighth transistor having its base connected to the base of said second transistor, and said sixth and eighth transistors having a conductivity type complementary to that of said first and second transistors.

4. The voltage-to-current converting circuit according to claim 1, further comprising a capacitor connected between the collector and the base of said output transistor.

* * * * *